(12) United States Patent
Collins et al.

(10) Patent No.: US 11,387,187 B2
(45) Date of Patent: Jul. 12, 2022

(54) EMBEDDED VERY HIGH DENSITY (VHD) LAYER

(71) Applicant: Intel Corporation, Santa Clara, CA (US)

(72) Inventors: Andrew Paul Collins, Chandler, AZ (US); Jianyong Xie, Chandler, AZ (US); Sujit Sharan, Chandler, AZ (US); Henning Braunisch, Phoenix, AZ (US); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 868 days.

(21) Appl. No.: 16/021,966

(22) Filed: Jun. 28, 2018

(65) Prior Publication Data

US 2020/0006236 A1    Jan. 2, 2020

(51) Int. Cl.
| | |
|---|---|
| *H01L 23/495* | (2006.01) |
| *H01L 23/053* | (2006.01) |
| *H01L 23/48* | (2006.01) |
| *H01L 21/4763* | (2006.01) |
| *H01L 23/538* | (2006.01) |
| *H01L 25/065* | (2006.01) |
| *H01L 21/48* | (2006.01) |
| *H01L 23/498* | (2006.01) |
| *H01L 23/522* | (2006.01) |
| *H01L 21/768* | (2006.01) |
| *H01L 23/528* | (2006.01) |
| *H01L 25/07* | (2006.01) |

(52) U.S. Cl.
CPC ........ *H01L 23/5386* (2013.01); *H01L 21/486* (2013.01); *H01L 21/4857* (2013.01); *H01L 21/76802* (2013.01); *H01L 23/481* (2013.01); *H01L 23/49822* (2013.01); *H01L 23/49838* (2013.01); *H01L 23/49894* (2013.01); *H01L 23/528* (2013.01); *H01L 23/5226* (2013.01); *H01L 23/5383* (2013.01); *H01L 25/0655* (2013.01); *H01L 25/072* (2013.01)

(58) Field of Classification Search
CPC ............. H01L 25/0567; H01L 23/5226; H01L 23/528; H01L 23/5386; H01L 23/49894; H01L 23/5383; H01L 23/481; H01L 25/0655; H01L 21/4857; H01L 21/486; H01L 21/76802; H01L 23/49822; H01L 23/49838; H01L 25/072
See application file for complete search history.

(56) References Cited

U.S. PATENT DOCUMENTS

| | | | |
|---|---|---|---|
| 9,331,370 B1* | 5/2016 | Jiang ....................... H01P 1/005 |
| 11,101,222 B2* | 8/2021 | Pietambaram .......... H01L 24/06 |
| 2011/0074041 A1* | 3/2011 | Leung .................... H05K 1/113 |
| | | | 257/774 |

(Continued)

*Primary Examiner* — Alonzo Chambliss
(74) *Attorney, Agent, or Firm* — Patent Capital Group

(57) ABSTRACT

Embodiments may relate to an interposer that has a first layer with a plurality of first layer pads that may couple with a die. The interposer may further include a second layer with a power delivery component. The interposer may further include a very high density (VHD) layer, that has a VHD pad coupled by a first via with the power delivery component and coupled by a second via with a first layer pad. Other embodiments may be described and/or claimed.

25 Claims, 9 Drawing Sheets

(56) References Cited

U.S. PATENT DOCUMENTS

| | | | | |
|---|---|---|---|---|
| 2012/0074579 A1* | 3/2012 | Su | ........................... | H01L 24/94 |
| | | | | 257/774 |
| 2012/0205791 A1* | 8/2012 | Su | ......................... | H01L 23/481 |
| | | | | 257/682 |
| 2014/0117562 A1* | 5/2014 | Aiba | .................. | H01L 23/49827 |
| | | | | 257/774 |
| 2015/0214142 A1* | 7/2015 | Kariyazaki | .......... | H05K 1/0253 |
| | | | | 257/774 |
| 2015/0255448 A1* | 9/2015 | Simion | .................... | H01L 25/18 |
| | | | | 257/774 |
| 2015/0333004 A1* | 11/2015 | Jomaa | ................. | H01L 23/5226 |
| | | | | 257/774 |
| 2016/0086885 A1* | 3/2016 | Inagaki | ............... | H01L 23/5386 |
| | | | | 257/774 |
| 2016/0181169 A1* | 6/2016 | Huang | ................ | H01L 23/5384 |
| | | | | 257/772 |
| 2016/0300824 A1* | 10/2016 | Karhade | ............. | H01L 23/5383 |

* cited by examiner

EMBEDDED VERY HIGH DENSITY (VHD) LAYER

FIELD

Embodiments of the present disclosure generally relate to the field of semiconductor packages.

BACKGROUND

In legacy package substrate technologies, the efficiency of the first layer interconnect (FLI) breakout may be limited by the C4 pad diameter or micro-via (uvia) pad diameter and the minimum trace width or spacing. If the die floor plan requires a higher FLI input/output (I/O) density than the substrate technology feature set can achieve, then additional breakout layers may be required and the package stack-up or z-height may need to increase. For very high bandwidth die-to-die interconnects, legacy packages may utilize 2.5D silicon interposers or embedded multi-die interconnect bridge (EMIB) technology.

However, layer count increases due to high FLI density requirements may increase substrate cost. For many packages thickness may be a function of layer count and may be tightly controlled. Therefore, layer count increases and a resultant thicker substrate may not always be a viable path.

For die stitching, 2.5D silicon interposers may have through silicon vias (TSVs) which may allow for a current flow path directly into each microbump location, but use of such interposers may increase the total cost of a resultant semiconductor package. The EMIB technology may offer a lower cost solution, but may have more restrictions on current flow path.

DETAILED DESCRIPTION

Figure 1:
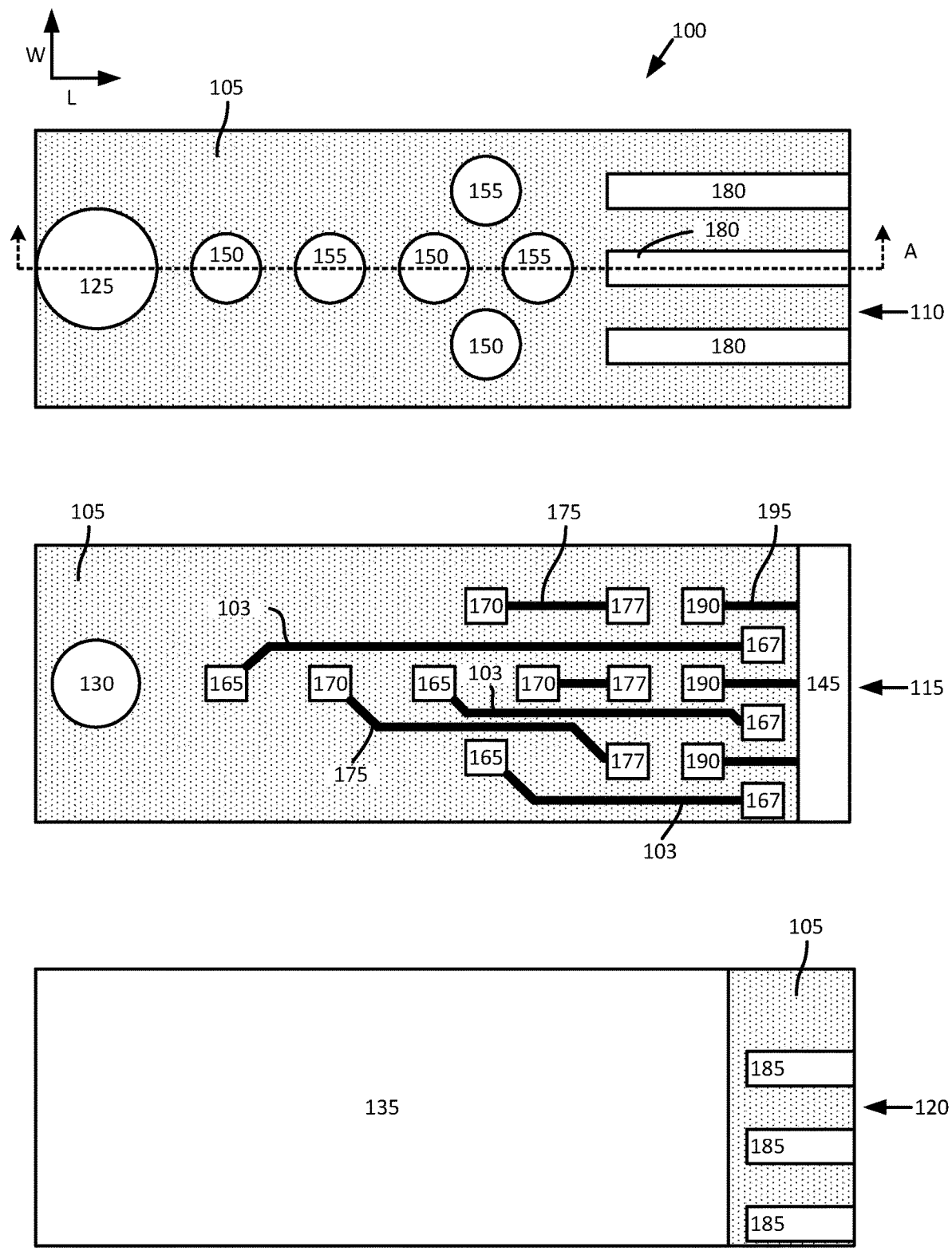
FIG. 1 illustrates a top view of an example package that includes an embedded VHD layer, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, describing a first feature as "formed on," "deposited on," "disposed on," etc. a second feature may mean that the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the subject matter disclosed herein. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. The Figures herein may be described with respect to various axes that may be depicted on the Figures. A distance along the "Z" axis may be referred to as a "height" or "z-height." A distance along the "L" axis may be referred to as a "length." A distance along the "W" axis may be referred to as a "width." Generally, the Z, L, and W axes may be perpendicular to one another.

Embodiments herein may relate to using a VHD layer as a redistribution layer embedded in a package substrate for two use cases. As used herein, "VHD" may refer to an organic substrate technology that may achieve greater than approximately 100 I/Os per millimeter (mm) per layer at fine pitches such as 55 micrometers ("microns" or "μm").

In one use case, the VHD technology may convert larger circular C4 pads into litho-based pads for improved efficiency of the FLI breakout. Another use case may relate to embedding VHD layers between standard build-up (BU) layers to meet high density die-to-die I/O stitching interconnect density that would otherwise use a 2.5D interposer in a legacy package. The embedded VHD layers may allow for a direct current flow path from the power delivery layers under the die shadow into fine pitch microbumps.

The litho-based rectangular vias may help maximize the FLI I/O breakout efficiency, which may create an opportunity for layer count reduction with designs that may otherwise require two or more break out layers. The main route of the signals may also benefit from reduced crosstalk by having the VSS reference plane closer to the die than may be achievable with a legacy package stack-up. An embedded VHD layer may also be used in a similar fashion for high bandwidth die-to-die interconnects with power delivery paths for direct vertical current flow into microbumps.

More generally, one embodiment, depicted in FIGS. 1 and 2 and described more fully below, may relate to using one VHD metal layer with litho-vias above and below it to improve FLI I/O density. The I/Os may via down from the C4 pad layer (which may be referred to as "layer 1" in some embodiments) to the VHD layer (which may also be referred to as "layer 2" in some embodiments) and may allow the signals to break out between the litho-vias as opposed to the large circular C4 pads on the surface layer. Once the signals are beyond the bump field, some portion of them may via back up to layer 1 for their main route, and another portion of them may via down to a layer below the VHD layer (which may be referred to as "layer 3" in some embodiments) for their main route.

Outside of the via field, the VHD layer may transition into a VSS reference layer for the layer 1 and layer 3 main routes at a dielectric thickness that may be lower than what a standard BU substrate may achieve. This reduced distance from signal to return path may benefit signal integrity in crosstalk dominated interfaces.

The above-described advantages with respect to the break out density and the main route crosstalk for a fixed trace pitch may reduce package layer count with similar signal integrity performance. Additionally, the litho-vias may enable FLI break out efficiency with the density limited by the minimum trace width on the legacy package BU layers.

Figure 2:
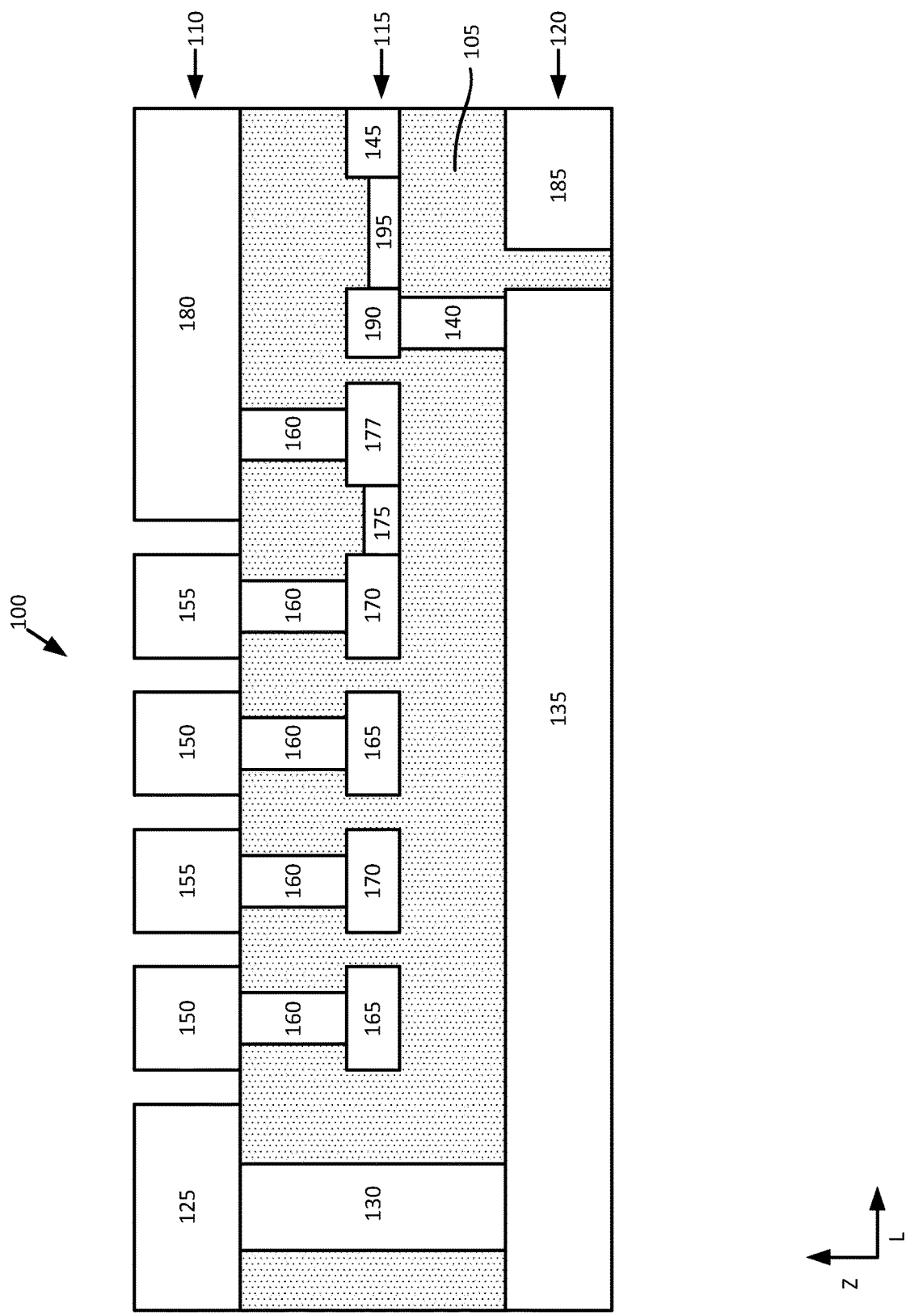
FIG. 2 illustrates a cut-away side view of the example package of FIG. 1, in accordance with various embodiments.

FIGS. 1 and 2 depict an embodiment of a package 100 that may use a VHD layer with litho-vias above and below it to improve FLI I/O density. Generally, FIG. 2 may depict a side view of the package 100 along the line "A" depicted in FIG. 1. The package 100 may include a plurality of layers as described above. Specifically, the package 100 may include a C4 layer (also referred to as "layer 1") 110, a VHD layer 115, and a layer 3 120. The total z-height of the package, including the C4 layer 110, the VHD layer 115, and the layer 3 120, may be between approximately 40 microns and approximately 100 microns if the package 100 is a coreless package. If the package 100 is a cored package, the total z-height of the package may be between approximately 250 microns and approximately 2500 microns.

For the sake of discussion herein, elements in each of the layers of FIG. 1 that are at generally the same width and length in one layer may be assumed to be "over" or "under" another element of a different layer of FIG. 1 that is at the same width and length. For example, VHD pads 165 may be assumed to be "over" traces 185 of layer 3 120. Similarly, data pad 150 may be assumed to be "over" VHD pad 165 of the VHD layer 115.

The package 100 may generally include an organic dielectric 105. The organic dielectric 105 may be, for example, a polymer matrix such as an epoxide, a polyimide, benzocyclobutene, etc. The polymer matrix may be filled with inorganic particles such as silicon dioxide (SiO2), aluminum oxide (Al2O3), a mixture of SiO2 and Al2O3, barium sulfate (BaSO4) or some other appropriate inorganic particle. The inorganic particles may, for example, reduce the coefficient of thermal expansion of the organic dielectric 105. The filling fraction of the particles into the organic material may be between approximately 0% to approximately 70% by weight. The size of the filler particles may range from approximately 0.01 micrometers ("microns" or "µm") in diameter (the particles being of arbitrary shape in general, but may be approximated as spheres or sphere-like) to approximately 10 microns in diameter. More specifically, in some embodiments the particles may have a diameter of approximately 1 micron.

The C4 layer 110 may be a standard BU layer and may include one or more C4 pads, such as power pad 125 which may generally have a z-height of between approximately 5 microns and approximately 25 microns. The power pad 125 may further have a diameter (as measured in the L/W plane) of between approximately 10 microns and approximately 80 microns. The C4 layer 110 may include one or more additional pads such as data pads 150 and 155 which may also have a z-height of between approximately 5 microns and approximately 25 microns and a diameter (as measured in the L/W plane) of between approximately 10 microns and approximately 80 microns. The various pads 125, 150, and 155 may be formed of a conductive material such as aluminum, copper, gold, etc., and may be configured to physically couple with one or more dies. It will be understood that even though the various pads of the C4 layer 110 are depicted as generally "circular," in other embodiments one or more of the pads may have a different shape such as elliptical, oval, etc.

Generally, the C4 layer 110 may, in some embodiments, be considered a "standard" BU layer. As used herein, a "standard" BU layer may refer to a layer with a metal thickness between approximately 8 microns and approximately 25 microns. The "standard" BU layer may further have a via or dielectric thickness of between approximately 10 microns and approximately 40 microns. Therefore, the total thickness or z-height of the "standard" BU layer may be between approximately 18 microns and approximately 65 microns. Further, a "standard" BU layer may refer to a layer with an 8/8 (as measured in microns) lines/space ratio.

Generally, the power pad 125 may be electrically coupled with a power delivery component of the same or a different layer, as will be described below. When coupled with the power delivery component, the power pad 125 may be configured to provide power to, or receive power from, the die to which the power pad 125 is coupled.

The data pads 150/155 may be communicatively coupled with another die or some other component such as a memory, a processor, a bus, a trace, etc. In some embodiments the data pads 150 and 155 may be directly coupled with the other component, while in other embodiments one or more additional elements such as a trace, a via, etc. may be positioned between the data pads 150/155 and the other elements. The data pads 150/155 may be configured to provide data or, or receive data from, a die physically coupled with the data pads.

The C4 layer may further include one or more traces 180. Generally, the traces 180 may have a width of approximately 8 microns and a z-height of between approximately 10 microns and approximately 40 microns. The traces 180 may be configured to physically with one or more die or couple with another trace external to the package 100.

The package 100 may further include a plurality of vias. In some embodiments, a power via 130 may electrically couple the power pad 125 with an element of layer 3 120, as discussed below. Other vias such as vias 160 may couple data pads 150/155 with VHD pads 165/170 of the VHD layer 115. In embodiments, the vias 160 may be lithographically defined. That is, the vias 160 may be formed in the organic dielectric 105 by a lithographic process that may include, for example, using a mask and forming the vias within the mask before removing the mask. As a result, the vias 160 may have one or more physical characteristics such as circular or non-circular cross-sectional areas, or walls that are generally orthogonal to the surface or face of the layer in which the vias 160 are present. More specifically, the walls of vias that are lithographically defined may be less than approximately five degrees from vertical. This may be contrasted with, for example, non-lithographically defined vias that may have sloped sidewalls or a circular cross-section.

The VHD layer 115 may further include one or more additional VHD pads such as VHD pads 167, 177, and 190. In embodiments, various of the VHD pads such as VHD pads 165, 170, and 177 may be communicatively coupled with the vias 160 as shown in FIG. 2. VHD pad 177 may be coupled with trace 180 by via 160 as shown in FIG. 2. VHD pads 190 and 167 may not be coupled with elements of the C4 layer 110, but rather may be coupled by one or more vias with elements of the Layer 3 120, as will be described in greater detail below.

In some embodiments, various of the VHD pads 165/167/170/177/190 may be coupled with another of the VHD pads or a power delivery component 145 of the VHD layer 115 by one or more traces such as traces 103, 175, or 195. It will be understood that each trace is not labeled in FIG. 1 for the sake of clarity of the Figure. However, like traces between like-numbered VHD pads may assume to have the same numbering when described herein. Specifically, traces 103 may communicatively couple VHD pads 165 and 167. Traces 175 may communicatively couple VHD pads 170 and 177. Traces 195 may communicatively couple VHD pads 190 and the power delivery component 145. The traces 175 and 195 are depicted in FIG. 2 as having a lower z-height than the various VHD pads 165/170/177/190. Generally, this depiction is for the sake of clearly illustrating the different elements, and is not intended to be definitive. In some embodiments the traces may have the lower z-height, while in other embodiments the traces may have the same z-height as one or more of the VHD pads 165/170/177/190.

Generally, the VHD pads 165/167/170/177/190 may be lithographically defined, for example using a lithographic process such as that described above with respect to the lithographic vias. More specifically, a mask may be defined, for example on the VHD layer 115, and then the material for the vias may be printed on the VHD layer 115 through openings in the mask. Subsequent to the printing, the mask may be removed. As a result of the lithographic process, the VHD pads 165/167/170/177/190 may be generally rectangular in shape as shown in FIG. 1. In embodiments, various of the VHD pads 165/167/170/177/190 may have a length of between approximately 5 microns and approximately 100 microns, a width of between approximately 5 microns and approximately 30 microns, and a z-height of between approximately 1 micron and approximately 7 microns. In other embodiments, one or more of the VHD pads 165/167/170/177/190 may not be rectangular, but rather may be square shaped or have some other cross-section in the L/W plane. In some embodiments one or more of the VHD pads 165/167/170/177/190 may not be distinct from, and instead may be an element of, the traces 103/175/195 to which the VHD pads 165/167/170/177/190 are coupled. In other words, the traces 103/175/195 may itself be the VHD pad and may be directly coupled with a via such as vias 160 or later-described vias 140.

As noted above, in embodiments the VHD layer 115 may further include a power delivery component 145. The power delivery component 145 may, for example, be a VSS reference layer (which may also be referred to as a "ground"), a VCC layer (which may also be referred to as a power supply) or some other power delivery component.

The layer 3 120 of the package 100 may similarly include a power delivery component 135, which may be similar to power delivery component 145. The power delivery component 135 may be communicatively coupled with VHD pad 190 by via 140, which may be similar to vias 160. Similarly, the power delivery component 135 may be communicatively coupled with power pad 125 by power via 130 as shown in FIG. 2. The layer 3 120 of the package 100 may further include one or more traces 185, which may be similar to traces 180.

Generally, as can be seen in FIGS. 1 and 2, the various pads, vias, and traces may allow connections between various of the layers. Specifically, the power delivery component 145 may be communicatively coupled by VHD traces 195 to VHD pad 190, which in turn is coupled with power delivery component 135 by via 140. Power delivery component 135 may be in turn coupled with power pad 125 by power via 130 as described above. In this manner, a die coupled with power pad 125 may be communicatively coupled with power delivery component 145 of the VHD layer 115.

Similarly, data pad 150 may be coupled with VHD pad 165 by via 160. VHD pad 165 may be coupled with another of the VHD pads 167 by trace 103. The other VHD pad 167 may then be coupled with one of the traces 185 by a via that is not shown in FIG. 2 based on the specific cross-section of FIG. 2, but may be assumed to be generally similar to via 140. In this way, a die coupled with data pad 150 may be communicatively coupled with trace 185 of layer 3 120.

Similarly, data pad 155 may be coupled with VHD pad 170 by via 160. The VHD pad 170 may be coupled with VHD pad 177 by trace 175. VHD pad 177 may be coupled with trace 180 by via 160. In this way, a die coupled with data pad 155 may be communicatively coupled with trace 180 of the C4 layer 110.

The configuration depicted in FIGS. 1 and 2 is one example of a configuration that may achieve the above-described advantages of this embodiment. It will be understood, however, that this configuration is intended as one example of such an embodiment. Other embodiments may have a different number of configuration of various elements such as traces, pads, etc. and still achieve similar advantages as those described above.

Figure 3:
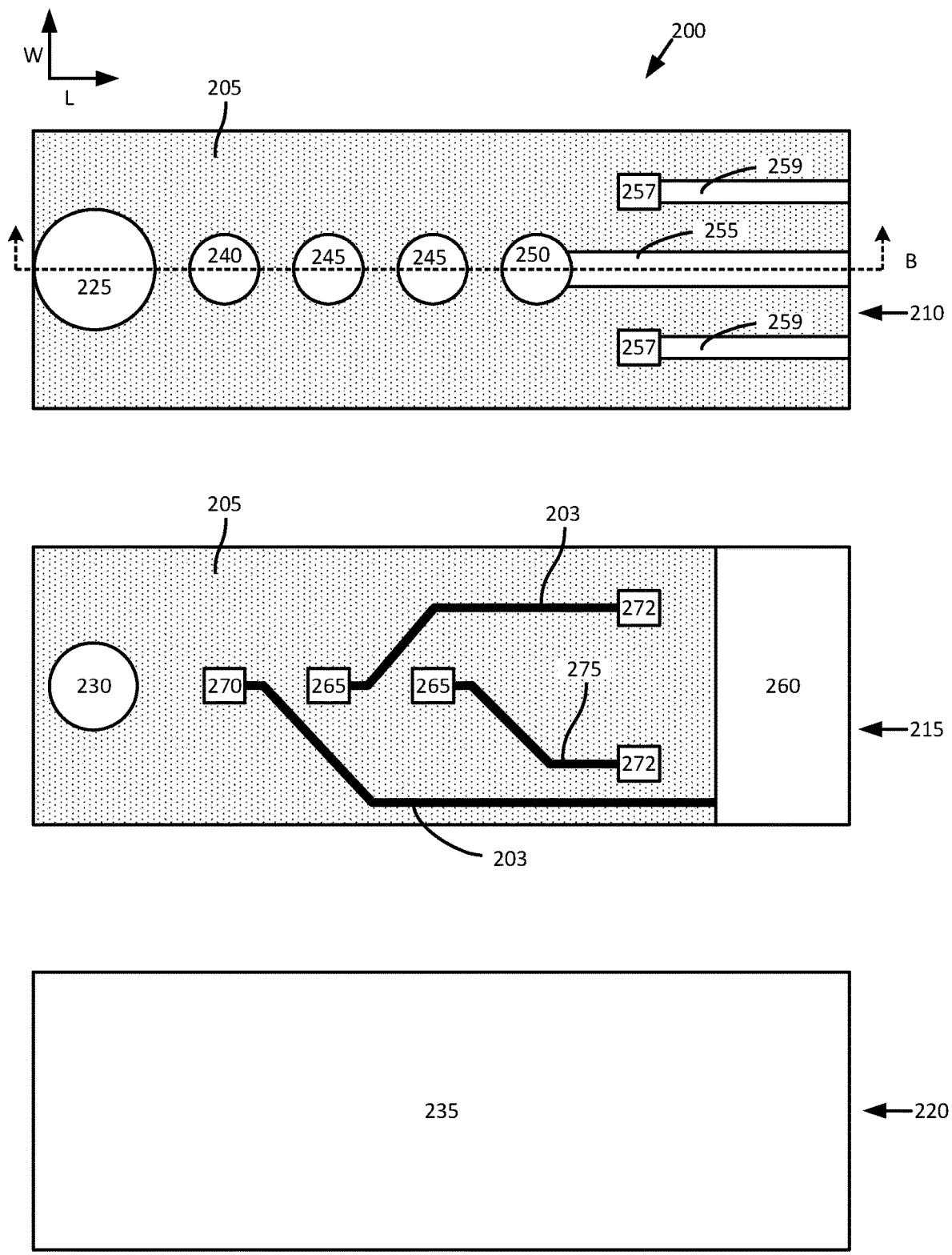
FIG. 3 illustrates a top view of another example package that includes an embedded VHD layer, in accordance with various embodiments.
Figure 4:
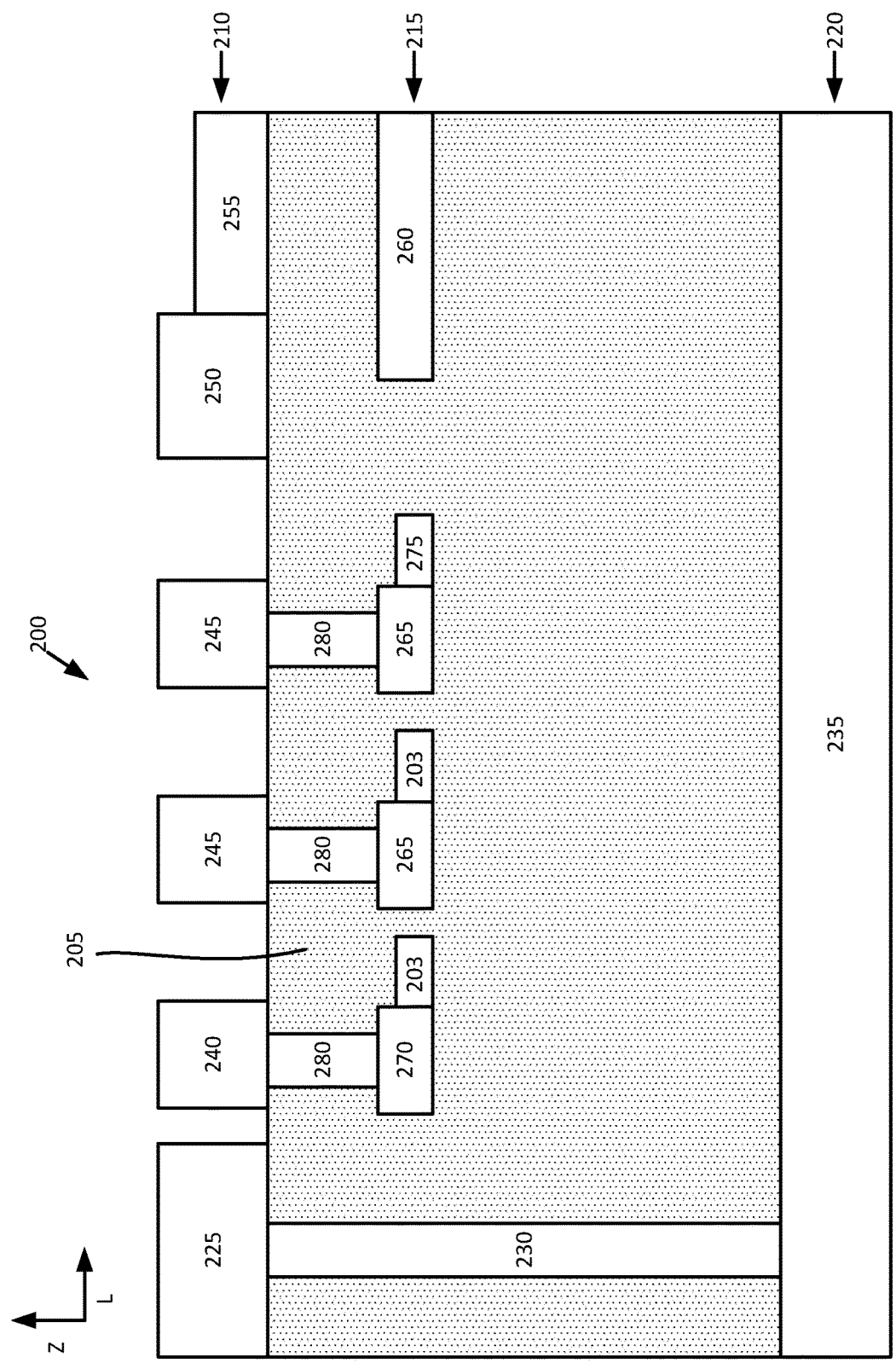
FIG. 4 illustrates a cut-away side view of the example package of FIG. 3, in accordance with various embodiments.

In another embodiment as depicted in FIGS. 3 and 4 and described in further detail below, space constrained surface layer routes such as double data rate (DDR) to package-on-package (PoP) dynamic random access memory (DRAM) may also benefit from the above-described high density/lower-crosstalk main route. In this embodiment, the VHD breakout layer may be used to convert the circular C4 pad to rectangular litho via pads for I/O breakout on the layer 1 main route. This conversion from circular pad to rectangular pad may improve FLI break out density and the main route may again benefit from the close signal-to-VSS reference plane spacing through the micro-dielectric thickness (which may be referred to as "uDT"). For lower density I/O differential interfaces such as peripheral component interconnect express (PCIe) or a serializer/deserializer (SERDES) may have less crosstalk sensitivity but may also require a higher impedance. In these embodiments, the layer 2 VHD VSS may be voided with the layer 2 VSS referenced at a standard I/O-to-VSS gap. Generally, if a thin I/O-to-VSS reference is working against signal integrity (for example, because impedance may be too low), then once the I/Os may break out and are on the layer 3 120, then the VHD layer 115 may be "voided" such that the I/Os are now referencing the C4 layer 110 and achieving a higher impedance due to a larger I/O-to-VSS gap.

For the sake of providing context, in legacy packages, the VHD layer 115 may be flooded with VSS. However, in this embodiment, "void" may refer to removing metal on the VHD layer 115 above one or more of the I/O differential interface signal routes to enable a larger gap from signals on layer 3 120 to VSS on the C4 layer 110. As a result, layer 3 signal reference the C4 layer 110 directly, skipping the VHD layer 115 (which may be devoid of metal above the signals of interest). However, it will be recognized that this may be only one example and in other embodiments the opposite may occur for signals that are to be routed on the C4 layer 110.

FIGS. 3 and 4 depict an embodiment of a package 200 that may use a VHD layer with litho-vias above and below it to improve FLI breakout density. Generally, FIG. 4 may depict a side view of the package 200 along the line "B" depicted in FIG. 3. The package 200 may include a plurality of layers as described above. Specifically, the package 200 may include a C4 layer (also referred to as "layer 1") 210, a VHD layer 215, and a layer 3 220. The total z-height of the package, including the C4 layer 210, the VHD layer 215, and the layer 3 220 may be similar to the dimensions of the package 100 described above.

For the sake of discussion herein and similarly to the discussion of FIG. 1, elements in each of the layers of FIG. 3 that are at generally the same width and length in one layer may be assumed to be "over" or "under" another element of a different layer of FIG. 3 that is at the same width and length. For example, VHD pads 265 may be assumed to be "under" data pads 245 of the C4 layer 210.

Generally, the C4 layer 210, VHD layer 215, and layer 3 220 may be respectively similar to C4 layer 110, VHD layer 115, and layer 3 120 of FIGS. 1 and 2. The package 200 may include an organic dielectric 205, a power pad 225, and a power via 230 which may be respectively similar to organic dielectric 105, power pad 125, and power via 130. The C4 layer 210 may include a plurality of data pads such as data pads 240 and 245 which may be similar to data pads 150 and 155. Layer 3 220 of the package 200 may include a power delivery component 235, which may be similar to power delivery component 135.

The VHD layer 215 may include a plurality of VHD pads 265, 270, and 272 which may be similar to VHD pads such as VHD pads 165, 170, etc. The VHD layer 215 may further include a plurality of VHD traces 203 and 275, which may be similar to VHD traces 103 and 175. The VHD layer 215 may further include a power delivery component 260 which may be similar to power delivery component 145. Generally, various of the VHD pads 265/270 may be coupled with the data pads 240/245 by vias 280, which may be similar to vias 160.

The C4 layer 210 may further include additional data pads such as data pad 250 which may be similar to data pads 245. The data pad 250 may be coupled with a trace 255 which may be similar to traces 180.

Additionally, the C4 layer 210 may include additional litho pads 257. The litho pads 257 may be similar, for example, to VHD pads 270 or 265. Specifically, the litho pads 257 may be lithographically formed, for example as described above with respect to vias 165/167/170/177/190. As a result of the lithographic formation, the litho pads 257 may be generally rectangular in shape as shown in FIG. 3. In other embodiments, the litho pads 257 may be some other shape such as square, circular, triangular, etc. The litho pads 257 may be coupled with one or more traces 259, which may be similar to trace 255.

As can be seen in FIG. 4, elements of the VHD layer 215 may be relatively closer to the C4 layer 210. Specifically, in some embodiments the distance between an element of the VHD layer 215, such as traces 203 or 275, and the C4 layer 210 may be between approximately 2 microns and approximately 8 microns as measured along the Z-axis. This distance may be the micro-dielectric thickness, uDT, discussed above. By contrast, the distance between elements of the VHD layer 215 such as the power delivery component 235 and the layer 3 220 may be between approximately 10 microns and approximately 40 microns as measured along the Z-axis. This distance may be referred to as a standard dielectric thickness.

Generally, as can be seen in FIGS. 3 and 4, the various pads, vias, and traces may allow connections between various of the layers. Specifically, in some embodiments the power pad 225 may be coupled with the power delivery component 235 by power via 230. In embodiments the power delivery component 235 may be, for example, a power supply such as a VCC layer. More specifically, the layer 3 220 may be a standard BU layer and the power delivery component 235 may be a VCC layer in the standard BU layer. In this way, a die coupled with the power pad 225 may be able to receive power from the power delivery component 235.

Additionally, various of the data pads such as data pads 245 may be coupled with a VHD pad 265 by vias 280. The VHD pads 265 may be coupled with VHD pads 272 by VHD traces 203. The VHD pads 272 may be coupled with litho pads 257 by additional vias that are not shown in FIG. 4 based on the specific cross-section of FIG. 4, but may be assumed to be generally similar to via 280. In this way, a die couple with the data pads 245 may be communicatively coupled with litho pads 257, and more specifically with traces 259.

Additionally, other of the data pads such as data pads 240 may be coupled with a VHD pad 270 by via 280. The data pad 270 may be coupled with the power delivery component 260 by trace 275. In embodiments, the power delivery component 260 may be a VSS reference layer, which may also be referred to as a ground. In this way, one or more of the data pads 240, and particularly a die coupled with the data pads 240, may be coupled with ground.

The configuration depicted in FIGS. 3 and 4 is one example of a configuration that may achieve the above-described advantages of this embodiment. It will be understood, however, that this configuration is intended as one example of such an embodiment. Other embodiments may have a different number of configuration of various elements such as traces, pads, etc. and still achieve similar advantages as those described above. Generally, the configuration described above may provide advantages such as improving FLI break out density at the C4 layer 210, and the C4 layer may again benefit from the close signal-to-VSS reference layer spacing through the micro-dielectric thickness (which may be referred to as "uDT"). It will be particularly noted that the use of the litho pads 257 at the C4 layer 210 may assist in improving the FLI break out density at the C4 layer 210 by allowing more pads to be present on the C4 layer.

Figure 5:
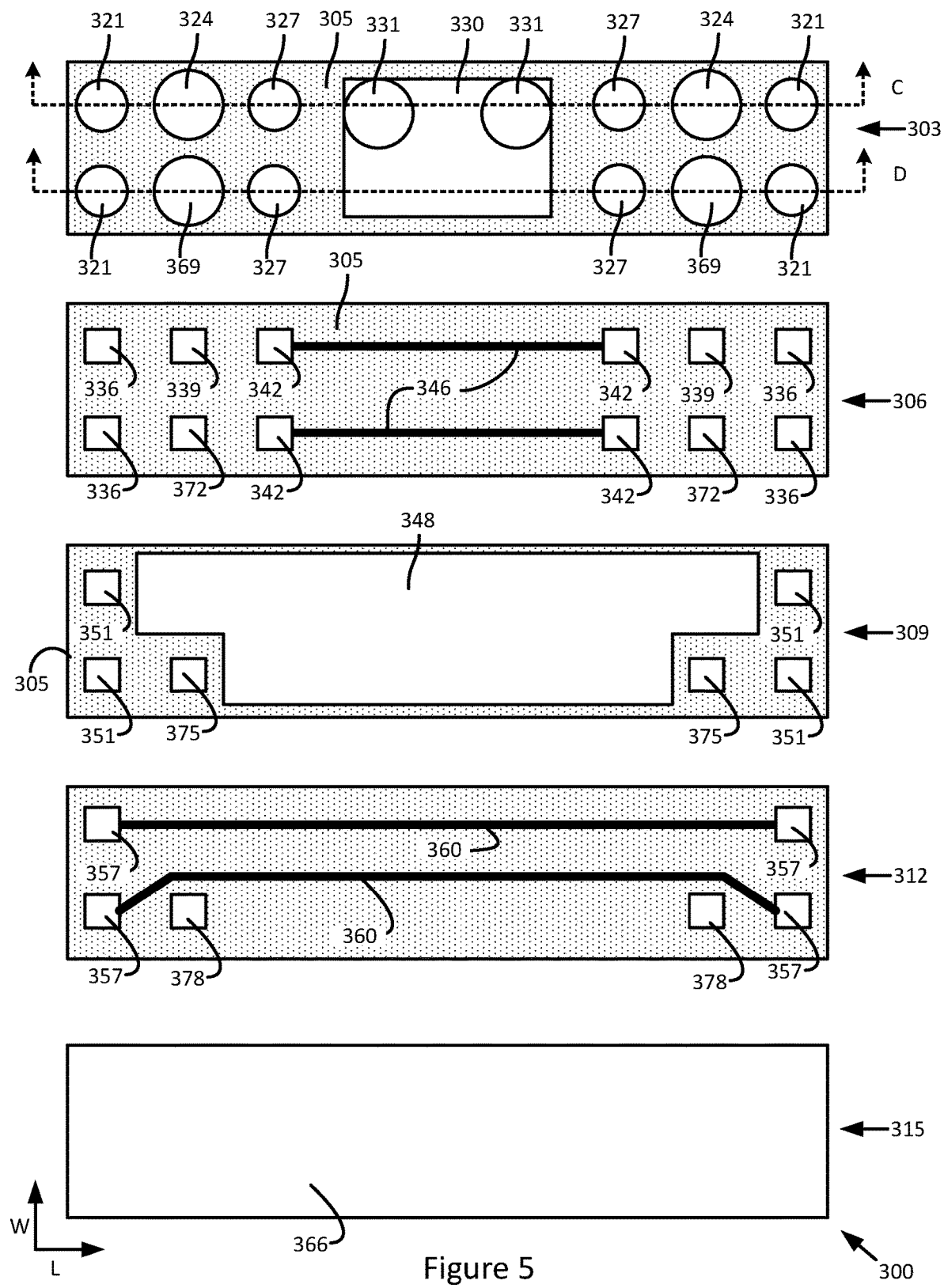
FIG. 5 illustrates a top view of another example package that includes an embedded VHD layer, in accordance with various embodiments.
Figure 6:
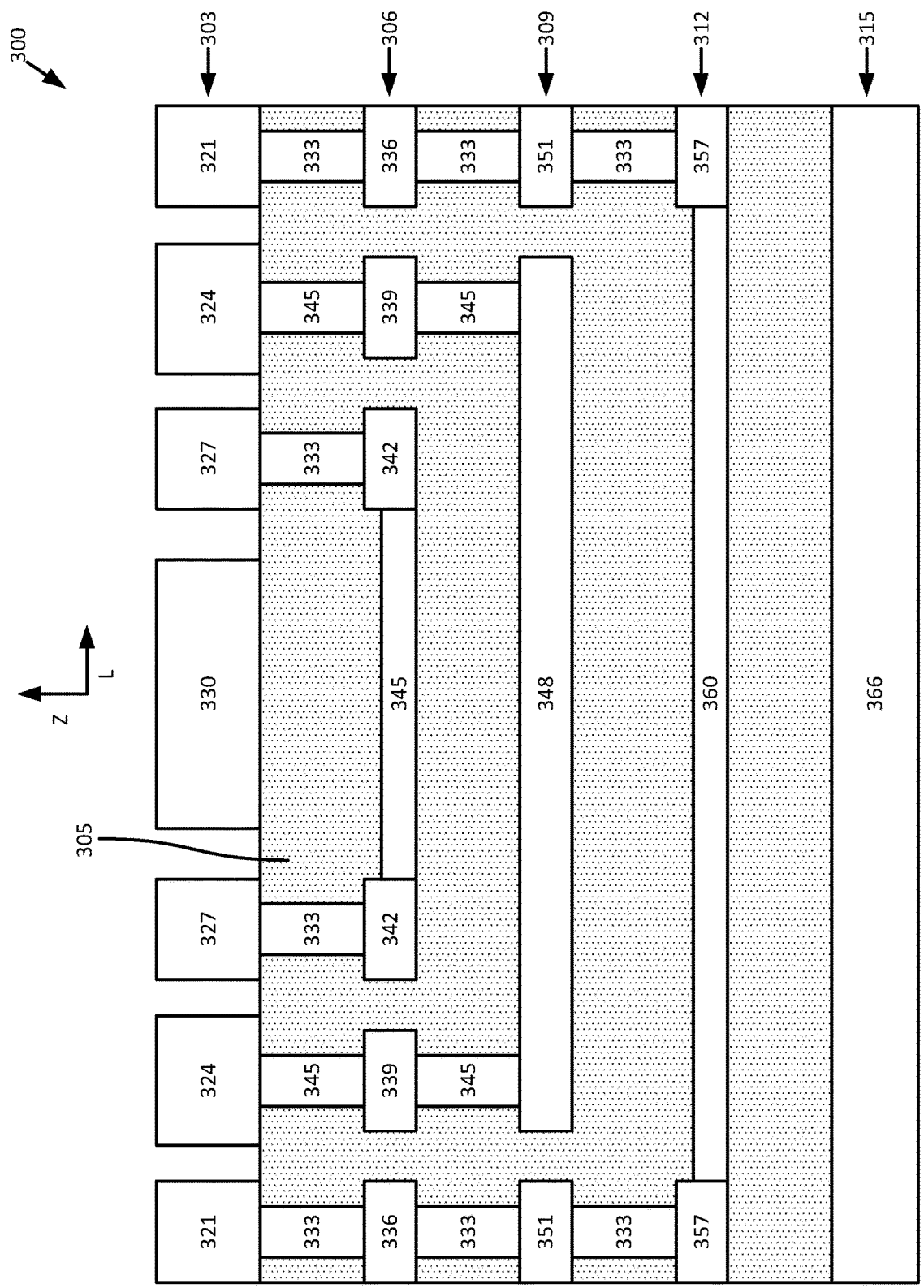
FIG. 6 illustrates a cut-away side view of the example package of FIG. 5, in accordance with various embodiments.
Figure 7:
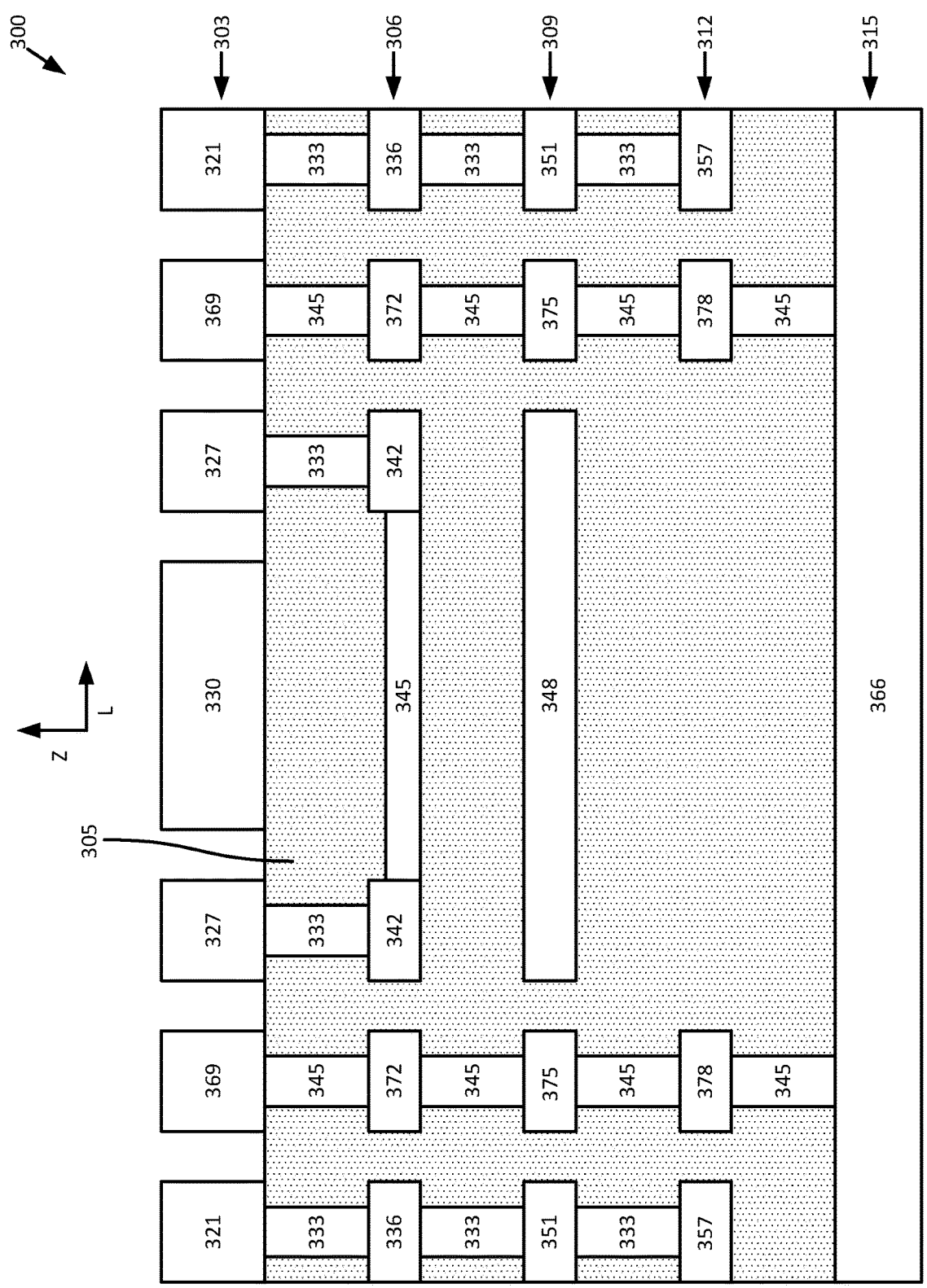
FIG. 7 illustrates another cut-away side view of the example package of FIG. 5, in accordance with various embodiments.

Another embodiment, such as that shown in FIGS. 5, 6, and 7, may apply the VHD concept to high bandwidth die-to-die interconnects. In these embodiments, different variants of VHD and BU layers may be used based on the routing density needs of that interconnect. One concept might embed 3 VHD layers (e.g., I/O, VSS, and I/O) below the surface layer (which may also be referred to as the C4 pad layer) of the package.

Power delivery and signal-to-motherboard routes outside of the VHD layer interface may traverse from, for example, layer 1 to layer 5 through standard micro vias because of the very thin metal and dielectric thicknesses required in the VHD layers. Another variant of this embodiment may alternate between standard BU layers and VHD layers, with the VHD layers only being utilized for the signal routing layers. Generally, this embodiment and variations thereof may allow for a direct path for VCC-VSS current flow into each microbump for improved power delivery with more flexibility regarding microbump pattern design.

FIGS. 5, 6, and 7 illustrate a package 300 that provides an example configuration for the above-described embodiment. Generally, FIG. 6 may depict a side view of the package 300 along the line "C" depicted in FIG. 5, and FIG. 7 may depict a side view of the package 300 along the line D depicted in FIG. 5. The package 300 may include a plurality of layers as described above. Specifically, the package 300 may include a C4 layer 303, a second layer 306, a third layer 309, a fourth layer 312, and a fifth layer 315. The total z-height of the package, including the layers 303, 306, 309, 312, and 315 may be similar to the height of package 100 described above. In some embodiments, various of the layers such as the second layer 306, the third layer 309, and the fourth layer 312 may be VHD layers similar to VHD layers 115 or 215. In other embodiments, one or more of the layers such as the third layer 309 may be a standard BU layer with dimensions similar to those described above with respect to the standard BU C4 layer 110.

For the sake of discussion herein and similarly to the discussion of FIG. 1, elements in each of the layers of FIG. 5 that are at generally the same width and length in one layer may be assumed to be "over" or "under" another element of a different layer of FIG. 5 that is at the same width and length.

The package 300 may include a plurality of data pads such as data pads 321 and 327 which may be similar to data pads 240, 245, etc. The package 300 may also include a plurality of power pads such as power pads 324, 369, and 331, which may be similar to, for example, power pads 225 or 125. The package 300 may also include an organic dielectric 305 which may be similar, for example, to organic dielectric 105 or 205.

In some embodiments, the package 300 may also include a plurality of power delivery components such as power delivery components 330, 348, or 366. The power delivery components 330/348/366 may be similar, for example, to power delivery components 235, 260, 135, or 145.

The package 300 may further include a plurality of VHD pads such as VHD pads 336, 342, or 357, which may be similar to, for example, VHD pads 270, 265, 165, etc. As can be seen in FIGS. 5-7, the VHD pads 336, 342, and 357 may be in the second layer 306 and the fourth layer 312. In this embodiment, the second layer 306 and the fourth layer 312 may both be VHD layers that may be similar to, for example, VHD layers 115 or 215. Second layer 306 and fourth layer 312 may further include VHD traces 346 and 360 which may be similar to, for example, VHD traces 103, 175, 195, 203, 275, etc.

The package 300 may further include one or more vias such as vias 333, which may be similar to vias such as vias 280 or 160. Similarly, the package 300 may include one or more power vias such as power vias 345 which may be similar to, for example, power vias 130 or 230.

One or more of the layers such as the second layer 306, third layer 309, or fourth layer 312 may include an additional power pad such as power pads 372, 375, 378, or 339. In embodiments, one or more of the power pads 372/375/378/339 may be similar to an above-described VHD pad such as VHD pad 270, 170, 165, etc. That is, one or more of the power pads 372/375/378/339 may be lithographically formed and have dimensions similar to those described above with respect to the VHD pads. Specifically, in some embodiments one or more of the power pads 372/375/378/339 may have a rectangular cross-section as illustrated in FIG. 5. In other embodiments, one or more of the power pads 372/375/378/339 may have different dimensions than those of the VHD pads. For example, a power pad may have a circular cross-section, may have a larger dimension in terms of the Z, W, or L axes, etc.

Similarly, the package 300 may further include a pad 351 in the third layer 309. In embodiments where the third layer 309 is a VHD layer, the pad 351 may be a VHD pad similar to, for example, VHD pads 336, 357, etc. For example the VHD pad 351 may be lithographically formed and have a generally rectangular cross-section. In embodiments where the third layer 309 is a standard BU layer, the pad 351 may be lithographically formed or formed according to a different technique or process. The pad 351 may have a different cross-section (for example circular, square, etc.) Additionally, the pad 351 may have different dimensions (for example, be larger or smaller along the L, W, or Z axes).

As can be seen, the embodiment depicted in FIGS. 5-7 may provide various advantages. Specifically, the package 300 may allow for inter-die communication. That is, a die coupled with a data pad such as data pad 321 or 327 may be communicatively coupled with another die coupled with another of the data pads 321 or 327 through various of the VHD pads (336, 357, 342, etc.) and VHD traces (346, 360, etc.)

Similarly, the die may be coupled directly with various of the power delivery components such as power delivery components 330, 348, or 366. More specifically, in some embodiments a die may be coupled directly with power delivery component 330 by coupling directly with power pad 331. In this embodiment, the power delivery component 330 may be, for example, a VSS reference layer. Similarly, a die may be coupled, via power pad 324, with power delivery component 348 as clearly shown in FIG. 6. In this embodiment the power delivery component 348 may also be a VSS reference layer. Similarly, a die may be coupled, via power pad 369, with power delivery component 366 as clearly shown in FIG. 7. In this embodiment, the power delivery component 366 may be a VCC layer.

The configuration depicted in FIGS. 5, 6, and 7 is one example of a configuration that may achieve the above-described advantages of this embodiment. It will be understood, however, that this configuration is intended as one example of such an embodiment. Other embodiments may have a different number of configuration of various elements such as traces, pads, layers, etc. and still achieve similar advantages as those described above. Generally, the configuration described above may provide advantages such as allowing for a direct path for VCC-VSS current flow into each microbump for improved power delivery with more flexibility regarding microbump pattern design.

It will be understood that the various embodiments depicted in FIGS. 1-7 are intended merely as examples, and variations of specific elements may be present in other embodiments. For example, as stated above different layouts of elements, numbers of elements, etc. may be present in other embodiments. Additionally, even though certain of the vias such as power vias 130 or 230 are depicted as generally vertical, in some embodiments the vias may not have perfectly vertical sidewalls. This variation may be based on, for example, the type of process used to form the vias.

Figure 8:
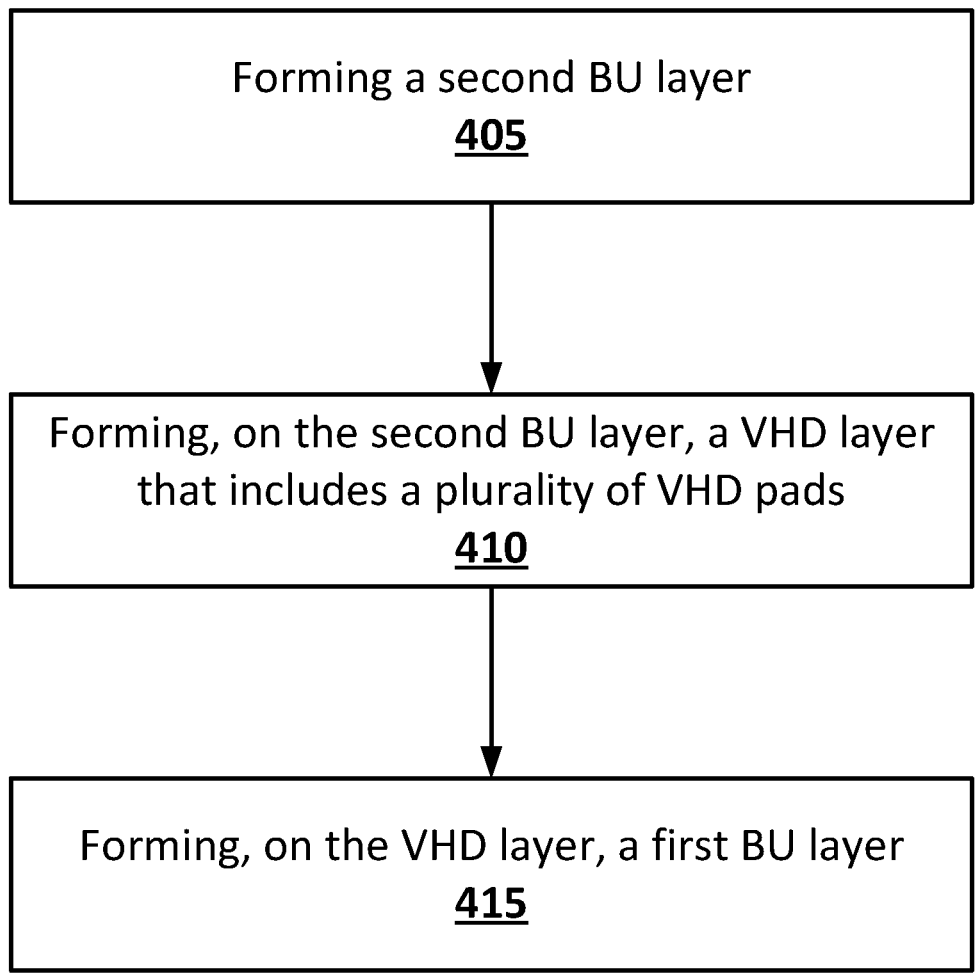
FIG. 8 illustrates a technique for generating a package that includes an embedded VHD layer, in accordance with various embodiments.

FIG. 8 depicts an example technique for generating a package such as packages 100, 200, or 300. The technique may include forming, at 405, a second BU layer. The second BU layer may be, for example, layer 3 120, layer 3 220, or the fifth layer 315 of packages 100/200/300. In embodiments where the third layer 309 is a BU layer, the second BU layer may be third layer 309.

The technique may further include forming, at 410 on the second BU layer, a VHD layer that includes a plurality of VHD pads. The VHD layer may be, for example, VHD layer 115, VHD layer 215, second layer 306, or second layer 312. In embodiments where the third layer 309 is a VHD layer, the VHD layer may be third layer 309. The VHD pads may be the above-described VHD pads such as VHD pad 165, VHD pad 270, VHD pad 342, etc. In some embodiments, various of the VHD pads may be coupled with others of the VHD pads by a VHD trace such as VHD traces 103, 175, 195, 203, 275, 346, 360, etc.

The technique may further include forming, at 415 on the VHD layer, a first BU layer. The first BU layer may be, for example, C4 layer 110, C4 layer 220, or C4 layer 303. In embodiments wherein the third layer 309 is a BU layer, the first BU layer may be third layer 309.

It will be understood that the above-described technique is just one example technique. Similar techniques with slight modifications or variations may be used for packages similar to those of packages 100/200/300, but having variations therefrom with respect to elements such as number of layers, etc.

Figure 9:
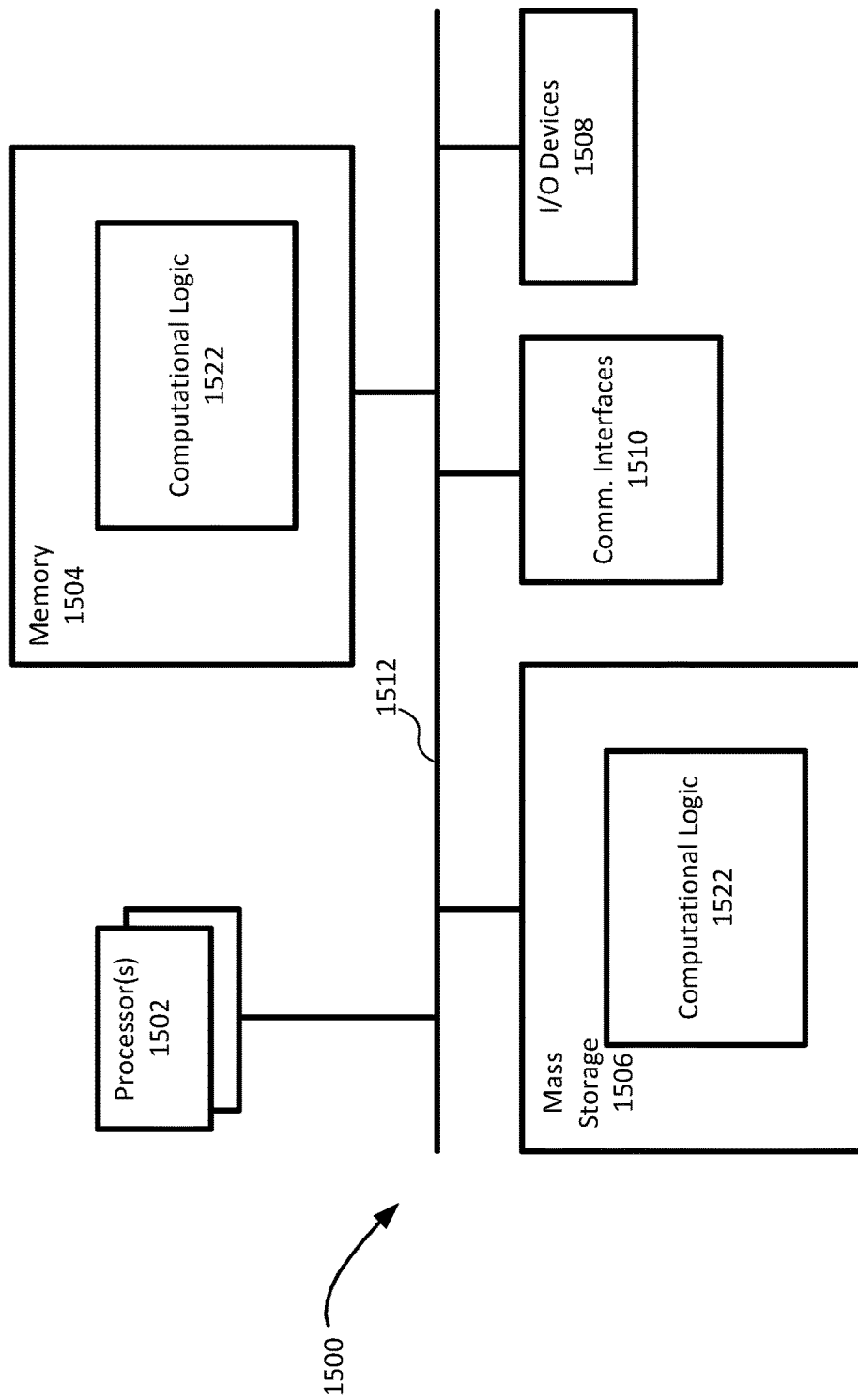
FIG. 9 illustrates an example device that may use the package of any of FIGS. 1-7, in accordance with various embodiments.

FIG. 9 illustrates an example computing device 1500 suitable for use with packages 100, 200, or 300 (collectively, "packages 100-300"), in accordance with various embodiments. Specifically, in some embodiments, the computing device 1500 may include one or more of packages 100-300 therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid-state mass storage, and so forth. Volatile memory may include, but is not limited to, static and/or DRAM. Non-volatile memory may include, but is not limited to, electrically erasable programmable read-only memory, phase change memory, resistive memory, and so forth.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply 1525. The power supply 1525 may, for example, be a power supply that is internal to the computing device 1500 such as a battery. In other embodiments the power supply 1525 may be external to the computing device 1500. For example, the power supply 1525 may be an electrical source such as an electrical outlet, an external battery, or some other type of power supply. The power supply 1525 may be, for example alternating current (AC), direct current (DC) or some other type of power supply. The power supply 1525 may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply 1525 may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)).

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra-mobile PC, a mobile phone, or a digital camera. In further implementations, the computing device 1500 may be any other electronic device that processes data.

In some embodiments, as noted above, computing device 1500 may include one or more of packages 100-300. For example, in some embodiments the processor 1502, memory 1504, or some other component of the computing device 1500 may be coupled with one or more of packages 100-300. More specifically, in some embodiments processor 1502, memory 1504, or some other component of the computing device 1500 may be the die coupled with one or more pads of the C4 layers 110/210/303.

EXAMPLES OF EMBODIMENTS HEREIN

Example 1 includes an interposer comprising: a first layer with a plurality of first layer pads, wherein a first first layer pad of the plurality of first layer pads is to couple with a first die; a second layer with a power delivery component; and a very high density (VHD) layer, wherein the VHD layer includes a first VHD pad of a plurality of VHD pads of the VHD layer, and wherein the first VHD pad is coupled by a first via with the power delivery component and the first VHD pad is coupled by a second via with the first first layer pad.

Example 2 includes the interposer of example 1, wherein respective pads of the plurality of VHD pads have a rectangular shape.

Example 3 includes the interposer of example 1, wherein the first via and the second via have walls that are less than five degrees away from vertical.

Example 4 includes the interposer of example 1, wherein respective pads of the plurality of first layer pads have a circular shape.

Example 5 includes the interposer of example 1, further comprising: a second VHD pad of the plurality of VHD pads, wherein the second VHD pad is coupled with a third VHD pad of the plurality of VHD pads by a VHD trace; a second first layer pad of the plurality of first layer pads, wherein the second first layer pad is coupled with the second VHD pad by a third via, and wherein the second first layer pad is to communicatively couple with the first die; and a third first layer pad of the plurality of first layer pads, wherein the third first layer pad is coupled with the third VHD pad by a fourth via, and wherein the third first layer pad is to communicatively couple with a second die.

Example 6 includes the interposer of any of examples 1-5, wherein the VHD layer includes an organic dielectric material.

Example 7 includes the interposer of any of examples 1-5, wherein the VHD layer has a trace density of greater than 100 traces per millimeter.

Example 8 includes the interposer of any of examples 1-5, wherein the power delivery component is a ground or a power supply.

Example 9 includes the interposer of any of examples 1-5, wherein the VHD layer is positioned between the first layer and the second layer.

Example 10 includes the interposer of any of examples 1-5, wherein the third layer is a VHD layer.

Example 11 includes a substrate comprising: a first build-up (BU) layer with a plurality of first layer pads; a second BU layer; and a very high density (VHD) layer with a plurality of VHD pads, the VHD layer positioned between the first BU layer and the second BU layer, wherein the VHD layer includes: a first VHD pad of the plurality of VHD pads that is communicatively coupled with a first first layer pad of the plurality of first layer pads by a first via; and a second VHD pad of the plurality of VHD pads that is communicatively coupled with a second first layer pad of the plurality of first layer pads by a second via and is coupled with the first VHD pad by a first VHD trace.

Example 12 includes the substrate of example 11, wherein the VHD layer includes an organic dielectric material.

Example 13 includes the substrate of example 11, wherein the VHD layer has a trace density of greater than 100 traces per millimeter.

Example 14 includes the substrate of example 11, wherein the first VHD pad is between 2 micrometers and 8 micrometers from the first BU layer.

Example 15 includes the substrate of example 11, wherein an element of the second BU layer is between 10 micrometers and 40 micrometers from the VHD layer.

Example 16 includes the substrate of example 11, wherein the VHD layer includes a power delivery component.

Example 17 includes the substrate of example 16, wherein the power delivery component is coupled with a third VHD pad of the plurality of VHD pads by a second VHD trace.

Example 18 includes the substrate of example 17, wherein the third VHD pad is coupled with a third first layer pad by a third via.

Example 19 includes the substrate of example 16, wherein the power delivery component is a ground or a power supply component of the interposer.

Example 20 includes the substrate of any of examples 11-19, wherein the VHD layer further comprises a third VHD pad of the plurality of VHD pads, and the third VHD pad is communicatively coupled with a pad of the second BU layer by a third via.

Example 21 includes the substrate of example 20, wherein the VHD layer further comprises a fourth VHD pad of the plurality of VHD pads, and the fourth VHD pad is coupled with the third VHD pad by a second VHD trace.

Example 22 includes the substrate of example 21, wherein the fourth VHD pad is coupled with a third first layer pad of the plurality of first layer pads by a fourth via.

Example 23 includes the substrate of any of examples 11-19, wherein respective VHD pads of the plurality of VHD pads have a rectangular shape.

Example 24 includes the substrate of any of examples 11-19, wherein the first via and the second via are lithographically defined.

Example 25 includes a method of forming an interposer that includes a very high density (VHD) layer, the method comprising: forming a second build-up (BU) layer; forming, on the second BU layer, the VHD layer, wherein the VHD layer includes a plurality of VHD pads and a first VHD pad of the plurality of VHD pads is coupled with a second VHD pad of the plurality of VHD pads by a first VHD trace; and forming, on the VHD layer, a first BU layer such that the VHD layer is positioned between the first BU layer and the second BU layer.

Example 26 includes the method of example 25, further comprising lithographically forming a first via between the first BU layer and the VHD layer such that the first VHD pad is coupled with a first first layer pad of a plurality of first layer pads of the first BU layer.

Example 27 includes the method of example 26, further comprising lithographically forming a second via between the first BU layer and the VHD layer such that the second VHD pad is coupled with a second first layer pad of the plurality of first layer pads.

Example 28 includes the method of example 27, further comprising coupling a first die with the first first layer pad and a second die with the second first layer pad.

Example 29 includes the method of any of examples 25-28, further comprising lithographically forming a third via between the second BU layer and the VHD layer such that when the VHD layer is formed a third VHD pad of the plurality of VHD pads is coupled with a power delivery component of the second BU layer.

Example 30 includes the method of example 29, further comprising lithographically forming a fourth via between the first BU layer and the VHD layer such that when the first BU layer is formed the third VHD pad is coupled with a third first layer pad of a plurality of first layer pads of the first BU layer.

Example 31 includes the method of any of examples 25-28, wherein the VHD layer includes an organic dielectric material.

Example 32 includes the method of any of examples 25-28, wherein the VHD layer has a trace density of greater than 100 traces per millimeter.

Example 33 includes a computing system comprising: a substrate that includes a first build-up (BU) layer, a second BU layer, and a very high density (VHD) layer positioned between the first BU layer and the second BU layer; a first die coupled with a first first layer pad of a plurality of first layer pads of the first BU layer; and a second die coupled with a second first layer pad of the plurality of first layer pads; wherein the first first layer pad is coupled with a first VHD pad of a plurality of VHD pads of the VHD layer by a first via; the second first layer pad is coupled with a second VHD pad of the plurality of VHD pads by a second via; and the first VHD pad is coupled with the second VHD pad by a first VHD trace.

Example 34 includes the computing system of example 33, wherein respective pads of the plurality of VHD pads have a rectangular shape.

Example 35 includes the computing system of example 33, wherein the first via and the second via are lithographically defined.

Example 36 includes the computing system of example 33, wherein respective pads of the plurality of first layer pads have a rounded shape.

Example 37 includes the computing system of example 33, wherein the VHD layer includes an organic dielectric material.

Example 38 includes the computing system of example 33, wherein the VHD layer has a trace density of greater than 100 traces per millimeter.

Example 39 includes the computing system of any of examples 33-38, wherein the third layer includes a power delivery component coupled with a third VHD pad of the plurality of VHD pads by a third via.

Example 40 includes the computing system of example 39, wherein the third VHD pad is coupled with a third first layer pad of the plurality of first layer pads, and the third first layer pad is coupled with the first die.

Example 41 includes the computing system of example 39, wherein the third VHD pad is coupled with a fourth VHD pad of the plurality of VHD pads by a second VHD trace, the fourth VHD pad is coupled with a fourth first layer pad of the plurality of first layer pads, and the fourth first layer pad is coupled with the first die.

Example 42 includes the computing system of example 39, wherein the power delivery component is a ground or a power supply.

Example 43 includes the method of example 29, wherein the power delivery component is a ground or a power supply.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the present disclosure, including what is described in the Abstract, is not intended to be exhaustive or to limit the present disclosure to the precise forms described. While specific implementations of, and examples for, the present disclosure are described herein for illustrative purposes, various equivalent modifications are possible within the scope of the present disclosure, as those skilled in the relevant art will recognize.

These modifications may be made to the present disclosure in light of the above detailed description. The terms used in the following claims should not be construed to limit the present disclosure to the specific implementations disclosed in the specification and the claims.

The invention claimed is:

1. An interposer comprising:
a first layer with a plurality of first layer pads, wherein a first first layer pad of the plurality of first layer pads is to couple with a first die;
a second layer with a power delivery component; and
a very high density (VHD) layer, wherein the VHD layer includes a first VHD pad and a second VHD pad of a plurality of VHD pads of the VHD layer, and wherein the first VHD pad is coupled by a first via with the power delivery component and not coupled by a via with the plurality of first layer pads, and the second VHD pad is coupled by a second via with the first first layer pad and not coupled by a via with the power delivery component.

2. The interposer of claim 1, wherein respective pads of the plurality of VHD pads have a rectangular shape.

3. The interposer of claim 1, wherein the first via and the second via have walls that are less than five degrees away from vertical.

4. The interposer of claim 1, further comprising:
a third VHD pad of the plurality of VHD pads, wherein the third VHD pad is coupled with a fourth VHD pad of the plurality of VHD pads by a VHD trace;
a second first layer pad of the plurality of first layer pads, wherein the second first layer pad is coupled with the third VHD pad by a third via, and wherein the second first layer pad is to communicatively couple with the first die; and a third first layer pad of the plurality of first layer pads, wherein the third first layer pad is coupled with the fourth VHD pad by a fourth via, and wherein the third first layer pad is to communicatively couple with a second die.

5. The interposer of claim 1, wherein the VHD layer includes an organic dielectric material.

6. The interposer of claim 1, wherein the VHD layer has a trace density of greater than 100 traces per millimeter.

7. The interposer of claim 1, wherein the VHD layer is positioned between the first layer and the second layer.

8. A substrate comprising:
a first build-up (BU) layer with a plurality of first layer pads;
a second BU layer with a power delivery component; and
a very high density (VHD) layer with a plurality of VHD pads, the VHD layer positioned between the first BU layer and the second BU layer, wherein the VHD layer includes:
a first VHD pad of the plurality of VHD pads that is communicatively coupled with a first first layer pad of the plurality of first layer pads by a first via, wherein the first VHD pad is not communicatively coupled by a via to the power delivery component; and
a second VHD pad of the plurality of VHD pads that is communicatively coupled with a second first layer pad of the plurality of first layer pads by a second via and is coupled with the first VHD pad by a first VHD trace, and wherein the second VHD pad is not communicatively coupled by a via to the power delivery component.

9. The substrate of claim 8, wherein the VHD layer includes an organic dielectric material.

10. The substrate of claim 8, wherein the VHD layer has a trace density of greater than 100 traces per millimeter.

11. The substrate of claim 8, wherein the first VHD pad is between 2 micrometers and 8 micrometers from the first BU layer.

12. The substrate of claim 8, wherein the power delivery component of the second BU layer is between 10 micrometers and 40 micrometers from the VHD layer.

13. The substrate of claim 8, wherein the power delivery component is a first power delivery component, and wherein the VHD layer includes a second power delivery component.

14. The substrate of claim 8, wherein the VHD layer further comprises a third VHD pad of the plurality of VHD pads, and the third VHD pad is communicatively coupled with the power delivery component of the second BU layer by a third via and is not communicatively coupled by a via to the plurality of first layer pads.

15. The substrate of claim 8, wherein respective VHD pads of the plurality of VHD pads have a rectangular shape.

16. The substrate of claim 8, wherein the first via and the second via are lithographically defined.

17. A method of forming an interposer that includes a very high density (VHD) layer, the method comprising:
forming a second build-up (BU) layer with a power delivery component;
forming, on the second BU layer, the VHD layer, wherein the VHD layer includes a plurality of VHD pads and a first VHD pad of the plurality of VHD pads is coupled with a second VHD pad of the plurality of VHD pads by a first VHD trace, wherein the first and second VHD pads are not coupled to the power delivery component; and
forming, on the VHD layer, a first BU layer such that the VHD layer is positioned between the first BU layer and the second BU layer.

18. The method of claim 17, further comprising lithographically forming a first via between the first BU layer and the VHD layer such that the first VHD pad is coupled with a first first layer pad of a plurality of first layer pads of the first BU layer.

19. The method of claim 17, further comprising lithographically forming a third via between the second BU layer and the VHD layer such that when the VHD layer is formed a third VHD pad of the plurality of VHD pads is coupled with the power delivery component of the second BU layer.

20. The method of claim 19, wherein the power delivery component is a ground or a power supply.

21. The method of claim 17, wherein the VHD layer has a trace density of greater than 100 traces per millimeter.

22. A computing system comprising:
a substrate that includes a first build-up (BU) layer, a second BU layer with a power delivery component, and a very high density (VHD) layer positioned between the first BU layer and the second BU layer;
a first die coupled with a first first layer pad of a plurality of first layer pads of the first BU layer; and
a second die coupled with a second first layer pad of the plurality of first layer pads;
wherein the first first layer pad is coupled with a first VHD pad of a plurality of VHD pads of the VHD layer by a first via and the first VHD pad is not coupled by a via with the power delivery component;
the second first layer pad is coupled with a second VHD pad of the plurality of VHD pads by a second via and the second VHD pad is not coupled by a via to the power delivery component; and
the first VHD pad is coupled with the second VHD pad by a first VHD trace.

23. The computing system of claim 22, wherein respective pads of the plurality of first layer pads have a rounded shape.

24. The computing system of claim 22, wherein the VHD layer includes an organic dielectric material.

25. The computing system of claim 22, wherein the VHD layer further includes a third VHD pad of the plurality of VHD pads coupled to the power delivery component of the second BU layer by a third via and the third VHD pad is not coupled by a via to the plurality of first layer pads of the first BU layer.

* * * * *